United States Patent
Wu et al.

(10) Patent No.: US 11,594,465 B2
(45) Date of Patent: Feb. 28, 2023

(54) CHIP PACKAGE AND ELECTRONIC DEVICE

(71) Applicant: BEIJING BAIDU NETCOM SCIENCE AND TECHNOLOGY CO., LTD., Beijing (CN)

(72) Inventors: Zhenghui Wu, Beijing (CN); Canghai Gu, Beijing (CN)

(73) Assignee: BEIJING BAIDU NETCOM SCIENCE AND TECHNOLOGY CO., LTD., Beijing (CN)

( * ) Notice: Subject to any disclaimer, the term of this patent is extended or adjusted under 35 U.S.C. 154(b) by 105 days.

(21) Appl. No.: 17/211,104

(22) Filed: Mar. 24, 2021

(65) Prior Publication Data
US 2021/0210405 A1 Jul. 8, 2021

(30) Foreign Application Priority Data

Jun. 19, 2020 (CN) .......................... 202010565873.2

(51) Int. Cl.
*H01L 23/373* (2006.01)
*H01L 25/065* (2006.01)
(Continued)

(52) U.S. Cl.
CPC ............ *H01L 23/373* (2013.01); *H01L 23/15* (2013.01); *H01L 23/18* (2013.01); *H01L 24/13* (2013.01);
(Continued)

(58) Field of Classification Search
CPC .... H01L 23/373; H01L 23/18; H01L 25/0655
See application file for complete search history.

(56) References Cited

U.S. PATENT DOCUMENTS 9,653,428 B1 * 5/2017 Hiner ...................... H01L 24/96
2007/0132074 A1 * 6/2007 Tsai ..................... H01L 23/4093
257/E23.044
(Continued)

FOREIGN PATENT DOCUMENTS

CN 105655310 A 6/2016
CN 106104796 A 11/2016
(Continued)

OTHER PUBLICATIONS

Office Action for Chinese Application No. 202010565873.2, dated Nov. 2, 2021, 6 pages.
(Continued)

*Primary Examiner* — Dale E Page
*Assistant Examiner* — Wilner Jean Baptiste
(74) *Attorney, Agent, or Firm* — Lippes Mathias LLP

(57) ABSTRACT

The disclosure provides a chip package and an electronic device. The chip package includes: a package substrate, a semiconductor substrate provided on the package substrate and a first chip and a second chip provided on the semiconductor substrate. The semiconductor substrate includes a first group of pins and a second group of pins arranged on the semiconductor substrate and a connecting layer located between the first group of pins and the second group of pins. The connecting layer has a plurality of connecting channels, and the first group of pins and the second group of pins are connected through the plurality of connecting channels. The first chip has a third group of pins, the second chip has a fourth group of pins, and the third group of pins are connected to the first group of pins, and the fourth group of pins are connected to the second group of pins.

14 Claims, 1 Drawing Sheet

(51) Int. Cl.
  *H01L 23/15* (2006.01)
  *H01L 23/18* (2006.01)
  *H01L 23/00* (2006.01)
(52) U.S. Cl.
  CPC .......... *H01L 24/16* (2013.01); *H01L 25/0655* (2013.01); *H01L 2224/13111* (2013.01); *H01L 2224/1623* (2013.01)

(56) References Cited

U.S. PATENT DOCUMENTS

| | | | |
|---|---|---|---|
| 2011/0044015 A1* | 2/2011 | Koide | H01L 23/49838 29/830 |
| 2015/0171015 A1 | 6/2015 | Mahajan et al. | |
| 2015/0255429 A1 | 9/2015 | Katkar et al. | |
| 2015/0279828 A1 | 10/2015 | Koopmans et al. | |
| 2018/0166356 A1 | 6/2018 | Butt et al. | |
| 2020/0117610 A1 | 4/2020 | Berger et al. | |
| 2020/0168527 A1 | 5/2020 | Chang et al. | |

FOREIGN PATENT DOCUMENTS

| | | |
|---|---|---|
| CN | 110197793 A | 9/2019 |
| EP | 3399547 A1 | 11/2018 |
| EP | 3748672 A1 | 12/2020 |
| JP | 2008305838 A | 12/2008 |
| JP | 2011044561 A | 3/2011 |
| KR | 20160130820 A | 11/2016 |

OTHER PUBLICATIONS

Extended European Search Report for Application No. 21164761.5, dated Sep. 16, 2021, 10 pages.
Office Action for Japanese Application No. 2021-077625, dated Apr. 5, 2022, 3 pages.
Office Action for Korean Application No. 10-2021-0076851, dated Aug. 10, 2022, 5 pages.

* cited by examiner

CHIP PACKAGE AND ELECTRONIC DEVICE

CROSS REFERENCE TO RELATED APPLICATION

This application is based on and claims priority to Chinese patent application No. 202010565873.2, filed on Jan. 7, 2020, the entire content of which is hereby introduced into this application as a reference.

TECHNICAL FIELD

The present disclosure generally relates to a technical field of electronic devices, specifically a technical field of artificial intelligent chips.

BACKGROUND

Artificial Intelligence (AI) chips, also known as AI accelerators or computing cards, are modules configured to process a large number of computing tasks in AI applications.

As development of electronic technologies, upgrading speed of electronic devices becomes faster and faster, and markets have higher and higher requirements for chips used in the electronic devices.

BACKGROUND

The present disclosure provides a chip package and an electronic device.

In a first aspect, embodiments of the present disclosure provide a chip package. The chip package includes: a package substrate; a semiconductor substrate provided on the package substrate, the semiconductor substrate including a first group of pins and a second group of pins arranged on the semiconductor substrate and a connecting layer located between the first group of pins and the second group of pins, in which the connecting layer has a plurality of connecting channels, and the first group of pins and the second group of pins are connected through the plurality of connecting channels; and a first chip and a second chip provided on the semiconductor substrate, in which the first chip has a third group of pins, the second chip has a fourth group of pins, and the third group of pins are connected to the first group of pins respectively, and the fourth group of pins are connected to the second group of pins respectively.

In a second aspect, embodiments of the present disclosure provide an electronic device. The electronic device includes a housing; and a chip package provided inside a space enclosed by the housing. The chip package includes: a package substrate; a semiconductor substrate provided on the package substrate, the semiconductor substrate including a first group of pins and a second group of pins arranged on the semiconductor substrate and a connecting layer located between the first group of pins and the second group of pins, in which the connecting layer has a plurality of connecting channels, and the first group of pins and the second group of pins are connected through the plurality of connecting channels; and a first chip and a second chip provided on the semiconductor substrate, in which the first chip has a third group of pins, the second chip has a fourth group of pins, and the third group of pins are connected to the first group of pins respectively, and the fourth group of pins are connected to the second group of pins respectively.

It should be understood that the content described in this section is not intended to identify key or important features of the embodiments of the present disclosure, nor is it intended to limit the scope of the present disclosure. Additional features of the present disclosure are easily understood through the following description.

BRIEF DESCRIPTION OF THE DRAWINGS

The drawings are used to better understand the solution and do not constitute a limitation to the disclosure, in which.

DETAILED DESCRIPTION

Figure 1:
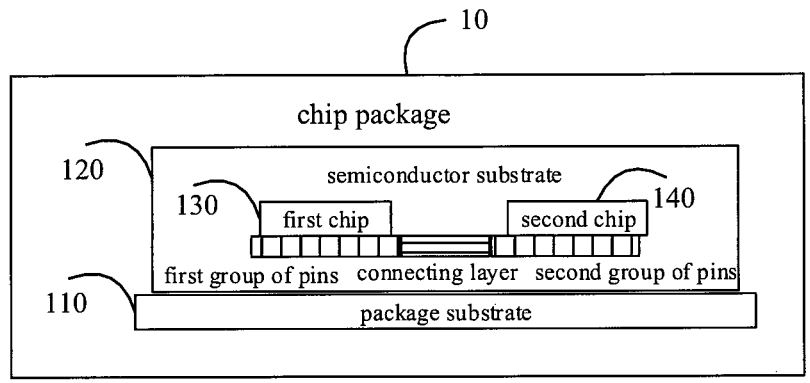
FIG. 1 is a schematic diagram of a chip package according to Embodiment 1 of the present disclosure.

The following describes the exemplary embodiments of the present disclosure with reference to the accompanying drawings, which includes various details of the embodiments of the present disclosure to facilitate understanding, which shall be considered merely exemplary. Therefore, those of ordinary skill in the art should recognize that various changes and modifications can be made to the embodiments described herein without departing from the scope and spirit of the present disclosure. For clarity and conciseness, descriptions of well-known functions and structures are omitted in the following description.

A chip package and an electronic device are described according to the attached drawings of the present disclosure.

In chip packaging technologies, two-dimensional (2D) packaging process assembles active electronic components and passive components with different functions, as well as other components such as Micro Electromechanical System (MEMS) and optical components together, to realize a single standard package with certain functions to form a system or subsystem. The 2D packaging process has low requirements for packaging accuracy and small challenges for packaging technology, and a package size of the package obtained through the 2D packaging process is relatively large.

According to requirements of Moore's Law for improvement of chip performance, every 18-24 months, a size of the chip is reduced by half and performance of the chip is doubled. With continuous development of electronic technologies and Internet technologies, markets require chip products that have high performance, low power consumption, small size and low delay to meet requirements of big data and artificial intelligence and the like. However, since 2D packaging process adopts a package substrate for directly arranging required chips (i.e., electronic components) thereon, it is difficult to realize the interconnection between the chips. Moreover, for designs that require tens of thousands or more of transistors, the size of the chip obtained by the 2D packaging process is bigger and bigger, and time delay for transferring signals is higher and higher, which may not meet design requirements of high density and low power consumption of the chip. Therefore, the related 2D packaging process may not meet the requirements of high performance and small size of Moore's Law.

In response to the above problems, the present disclosure provides a chip package. A semiconductor substrate is provided on a package substrate, and a first group of pins and a second group of pins are provided on the semiconductor substrate, and the first group of pins and the second group of pins are provided on the semiconductor substrate. The first group of pins and the second group of pins are connected through a plurality of connecting channels on a connecting layer. A third group of pins of a first chip arranged on the semiconductor substrate are connected to the first group of pins, and a fourth group of pins of a second chip arranged on the semiconductor substrate are connected to the second group of pins. Since the first group of pins and the second group of pins are connected, the third group of pins of the first chip and the fourth group of pins of the second chip are connected. Therefore, interconnection between the first chip and the second chip is realized. Moreover, with arranging the first chip and the second chip on the same semiconductor substrate and performing the interconnection between the first chip and the second chip, a distance between the two chip is shorten, thereby reducing time for transferring the signals and shortening the time delay for transferring the signals. Small time delay reflects that a speed for transferring the signals is relatively fast, equivalent to that throughput of an entire link is relatively large, which makes signal bandwidth wide. In addition, when the chip package of the present disclosure includes a plurality of semiconductor substrates, the plurality of semiconductor substrates are superimposed and connected to meet high-density packaging requirements for chips in a limited space, thereby saving a packaging area and reducing a packaging size. Therefore, the chip package according to the present disclosure meets the requirements of high performance and small size of Moore's Law.

FIG. 1 is a schematic diagram of a chip package according to Embodiment 1 of the present disclosure. As illustrated in FIG. 1, the chip package 10 includes: a package substrate 110, a semiconductor substrate 120 provided on the package substrate 110, and a first chip 130 and a second chip 140 provided on the semiconductor substrate 120.

As illustrated in FIG. 1, two groups of pins are provided on the semiconductor substrate 120, which respectively are a first group of pins and a second group of pins. The semiconductor substrate 120 further includes a connecting layer located between the first group of pins and the second group of pins, and the connecting layer has a plurality of connecting channels, the first group of pins and the second group of pins are connected through the plurality of connecting channels.

In this embodiment, the first chip 130 provided on the semiconductor substrate 120 has a third group of pins (not illustrated in FIG. 1), and the second chip 140 provided on the semiconductor substrate 120 has a fourth group of pins (not illustrated in FIG. 1). The third group of pins are respectively connected to the first group of pins, and the fourth group of pins are respectively connected to the second group of pins. Since the first group of pins and the second group of pins on the semiconductor substrate 120 are connected, the third group of pins are connected to the first group of pins, and the fourth group of pins are connected to the second group of pins, so that the third group of pins are connected to the fourth group of pins, thereby realizing the interconnection between the first chip and the second chip.

Since the first chip 130 and the second chip 140 are interconnected and provided on the same semiconductor substrate 120, a communication distance between the first chip 130 and the second chip 140 is shortened, and a signal output by one chip is rapidly transferred to another chip, so that the signal transmission time is reduced, the time delay for transferring signals is small. The small time delay results in that the speed for transferring signals is fast, which is equivalent to that the throughput of the entire link is relatively large and the signal bandwidth is relatively wide. Therefore, the chip package according to the embodiments of the present disclosure, compared to the package obtained through the related 2D packaging process, not only realizes the interconnection between the chips, but also reduces the time delay, saves energy consumption, and has a wide bandwidth.

It should be noted that, in FIG. 1, the first chip and the second chip are provided on the semiconductor substrate only as an example to explain the present disclosure, which is not limited in the present disclosure. In practical applications, a plurality of chips may be provided on the semiconductor substrate based on requirements to realize the interconnection of multi-chips.

In addition, FIG. 1 takes the chip package including one semiconductor substrate only as an example to explain the present disclosure, which is not limited in the present disclosure. In the practical applications, a plurality of semiconductor substrates may be configured based on requirements, and a plurality of chips may be provided on each semiconductor substrate. The plurality of semiconductor substrates may be connected by re-distribution layer technologies of chip process to realize the interconnection between the plurality of semiconductor substrates. The re-distribution layer technologies are to deposit a metal layer and a dielectric layer on a surface of a wafer and form a corresponding metal wiring pattern to re-layout input and output ports of the chip, and arrange the input and output ports in a new area where spaces of length of lay may be looser. With connecting the plurality of semiconductor substrates through the re-distribution layer technologies, the plurality of semiconductor substrates may be superimposed like a combination of building blocks, thereby meeting high-density packaging requirements of the chips in a limited space, saving the packaging area, and reducing the packaging size, so as to realize small size and high density design of the chip package.

In the embodiments of the present disclosure, the package substrate 110 may be, but is not limited to, a Ball Grid Array (BGA) substrate or a Multichip Module (MCM) substrate.

In an implementation of the embodiments of the present disclosure, the package substrate 110 may be a ceramic substrate.

The ceramic substrate refers to a special process board in which copper foil directly bonds to a surface of an alumina or aluminum-nitride ceramic substrate at high temperature, which has excellent electrical insulation performance and high thermal conductivity performance, as well as high adhesion strength and large current carrying capacity. Therefore, in the embodiments of the present disclosure, by using the ceramic substrate as the package substrate to carry the semiconductor substrate, the semiconductor substrate may be firmly attached to the ceramic substrate, and thermal conductivity and electrical insulation capacity of the chip package is improved, and availability of the chip package is improved.

In the embodiments of the present disclosure, the connection between the package substrate 110 and the semiconductor substrate 120 be made using related connection manners between the chip and the package substrate, and existing mature packaging processes are reused for packaging, thereby reducing difficulty of packaging and improving success rate of packaging.

In an implementation of the embodiments of the present disclosure, the third group of pins are connected to the first group of pins respectively through a plurality of first metal balls, and the fourth group of pins are connected to the second group of pins respectively through a plurality of second metal balls.

For example, for each pin in the third group of pins, the pin is connected to a corresponding pin in the first group of pins through a first metal ball. For each pin in the fourth group of pins, the pin is connected to a corresponding pin in the second group of pins through a second metal ball.

With connecting the third group of pins and the first group of pins through the plurality of the first metal balls, and connecting the fourth group of pins and the second group of pins respectively through the plurality of the second metal ball, it not only realizes interconnection between the pins, thus realizing the interconnection between the chips, but also improves flexibility of pins connection.

In the embodiments of the present disclosure, materials of the first metal balls and the second metal balls may be the same or different. For example, the first metal balls may be made of silver, and the second metal balls may be made of stannum, or both the first metal balls and the second metal balls may be made of silver or stannum.

In an implementation of the embodiments of the present disclosure, the plurality of first metal balls and the plurality of second metal balls may be made of stannum. For example, stannum balls with a small volume are used as the first metal balls and the second metal balls to connect the first group of pins and the third group of pins, and the second group of pins and the fourth group of pins. Due to use of the small stannum balls, gaps between the first chip 130 and the semiconductor substrate 120 and between the second chip 140 and the semiconductor substrate 120 are small, and connection density between the chips and the semiconductor substrate is increased. In addition, since a melting point of the stannum is relatively low, using the stannum to connect chips and the semiconductor substrate may be beneficial to protect the semiconductor substrate 120 from being damaged during soldering.

In a possible implementation of the embodiments of the present disclosure, the semiconductor substrate 120 may be formed by the chip process, and the plurality of connecting channels of the connecting layer may be formed by wiring process.

Procedures of the chip process include chip design, die production, package production and testing. The chip design is to generate chip patterns according to actual design requirements. The die production includes wafer production, wafer coating, wafer photoetching development and etching, doping of impurities and wafer testing. The package production is to fix the completed wafer and bond the pins. Different packaging forms are generated as requirements. Finally, the packaged chip is tested to remove defective products, and the chip production is completed.

In this disclosure, the semiconductor substrate is formed by the chip process, which simplifies manufacturing process of the semiconductor substrate, and the plurality of the connecting channels are formed by the wiring process, which provides conditions for realizing the interconnection between the chips through the semiconductor substrate.

In a possible implementation of the embodiments of the present disclosure, material of the semiconductor substrate 120 may be silicon, that is, the silicon substrate is used as a carrier for carrying the first chip 130 and the second chip 140. In this embodiment, the silicon substrate is manufactured using standard digital chip production process. Unlike other chips, the silicon substrate is manufactured using only a limited number of metal layers of the standard digital chip production process. In other words, by plating a small number of metal layers on an outer layer of a silicon wafer, such as plating gold, the silicon substrate with a long life is obtained, which has simple manufacturing process and low cost. Since the silicon substrate is manufactured using the chip production process, the silicon substrate has very rich wire wrapping resources, and a plurality of interfaces may be reserved, which is beneficial to expanding a plurality of chips, so that a plurality of chips may be expanded on the silicon substrate to realize the interconnection of the chips, which is beneficial to improving chip density and saving costs.

The packaged chip may heat up during use, when capability of heat dissipating of the chips is not good, the chips may be damaged. Therefore, in an implementation of the embodiments of the present disclosure, the chip package 10 may further include a heat dissipating layer (not shown in FIG. 1), and the heat dissipating layer covers the first chip 130 and the second chip 140. Therefore, with providing the heat dissipating layer covering the first chip 130 and the second chip 140 in the chip package, which is beneficial to the heat dissipating of the chips, so as to prolong service life of the chips.

Further, in an implementation of the embodiments of the present disclosure, the heat dissipating layer may be made of thermal glue. The thermal glue has an advantage of high thermal conductivity. Therefore, the thermal glue is used as the heat dissipating layer to cover the first chip and the second chip, which may improve efficiency of the heat dissipating the chip package and improve ease of use of the chips.

Figure 2:
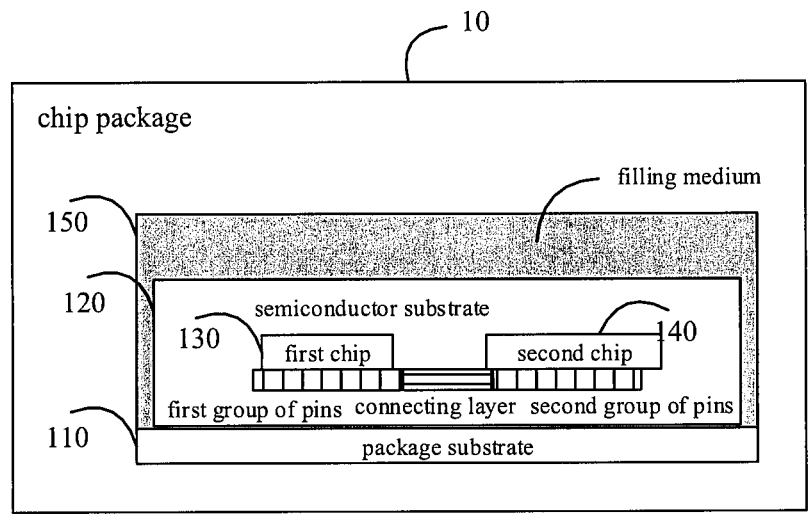
FIG. 2 is a schematic diagram of a chip package according to Embodiment 2 of the present disclosure.

FIG. 2 is a schematic diagram of a chip package according to Embodiment 2 of the present disclosure. As illustrated in FIG. 2, on the basis of FIG. 1, the chip package 10 further includes: a package housing 150 covering the package substrate 110 and filling medium filled in the package housing 150.

In FIG. 2, a shaded area represents the filling medium. The filling medium is used to fill an area between the package housing 150 and the package substrate 110, which may improve anti-pressure capacity of the chip package and avoid damage of the semiconductor substrate 120 on the package substrate 110 due to excessive pressure.

In this embodiment, the package housing 150 may be made of metallic iron, and the manufactured package housing 150 may be thin to improve the thermal conductivity.

In the embodiments of the present disclosure, with covering the package substrate with the package housing and filling the filling medium in the package housing, the anti-pressure capacity of the chip package during installation and use may be improved.

Figure 3:
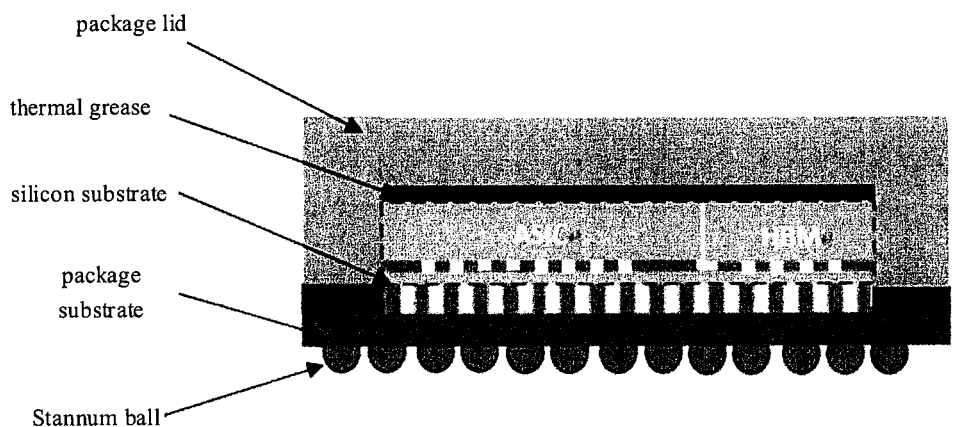
FIG. 3 is an exemplary diagram of a chip package according to a specific embodiment of the present disclosure.

FIG. 3 is an exemplary diagram of a chip package according to a specific embodiment of the present disclosure. In this example, the first chip is an Application Specific Integrated Circuits (ASIC), and the second chip is a High Bandwidth Memory (HBM). In FIG. 3, an area enclosed by dashed lines represents the silicon substrate. White banded zones on the silicon substrate are the pins in the embodiments of the present disclosure. The ASIC and HBM are provided on the silicon substrate through the pins, and the interconnection between ASIC and HBM is implemented by the silicon substrate. When connecting, the ASIC and the HBM are connected with the silicon substrate by using miniature stannum balls to increase the connection density between the chips and the silicon substrate and to reduce space occupation. In FIG. 3, the white banded zones on the package substrate are via holes. The silicon substrate and the package substrate are connected through the stannum and the via holes to package the silicon substrate on the package substrate, and the stannum balls under the package substrate are used to connect with other substrates. As illustrated in FIG. 3, the silicon substrate is covered with the thermal glue with high thermal conductivity to improve efficiency of heat dissipating. A packaging lid (i.e., the package housing in the embodiments of the present disclosure) is used to cover the package substrate. The package cover may be an ultra-thin iron lid used to improve the efficiency of the heat dissipating and to improve the anti-pressure capacity of the chips during the installation and the use.

It should be noted that in actually manufactured chip package, the pins on the silicon substrate, the via holes between the silicon substrate and the package substrate, and the stannum balls under the package substrate are invisible, and those are shown in FIG. 3 only for easy understanding of composition of the chip package, and cannot be used as a limitation to the present disclosure.

According to the embodiments of the present disclosure, the present disclosure also provides an electronic device. The electronic device includes the chip package described in the above embodiments.

In detail, the electronic device includes a housing; and a chip package provided inside a space enclosed by the housing. The chip package includes: a package substrate; a semiconductor substrate provided on the package substrate, the semiconductor substrate including a first group of pins and a second group of pins arranged on the semiconductor substrate and a connecting layer located between the first group of pins and the second group of pins, in which the connecting layer has a plurality of connecting channels, and the first group of pins and the second group of pins are connected through the plurality of connecting channels; and a first chip and a second chip provided on the semiconductor substrate, in which the first chip has a third group of pins, the second chip has a fourth group of pins, and the third group of pins are connected to the first group of pins respectively, and the fourth group of pins are connected to the second group of pins respectively.

It should be understood that the various forms of processes shown above can be used to reorder, add or delete steps. For example, the steps described in the disclosure could be performed in parallel, sequentially, or in a different order, as long as the desired result of the technical solution disclosed in the disclosure is achieved, which is not limited herein.

The above specific embodiments do not constitute a limitation on the protection scope of the present disclosure. Those skilled in the art should understand that various modifications, combinations, sub-combinations and substitutions can be made according to design requirements and other factors. Any modification, equivalent replacement and improvement made within the spirit and principle of this application shall be included in the protection scope of this application.

What is claimed is:

1. A chip package, comprising:
a package substrate;
a semiconductor substrate provided on the package substrate, the semiconductor substrate comprising:
a first group of pins and a second group of pins arranged on the semiconductor substrate;
a connecting layer located between the first group of pins and the second group of pins, wherein the connecting layer has a plurality of connecting channels, and the first group of pins and the second group of pins are connected through the plurality of connecting channels; and a first chip and a second chip provided on the semiconductor substrate, wherein the first chip has a third group of pins, the second chip has a fourth group of pins, and the third group of pins are connected to the first group of pins respectively, and the fourth group of pins are connected to the second group of pins respectively;

wherein the third group of pins are connected to the first group of pins respectively through a plurality of first metal balls, and the fourth group of pins are connected to the second group of pins through respectively a plurality of second metal balls; and wherein the plurality of first metal balls and the plurality of second metal balls are made of stannum.

2. The chip package according to claim 1, wherein the semiconductor substrate is made of silicon.

3. The chip package according to claim 1, further comprising:
a heat dissipating layer covering the first chip and the second chip.

4. The chip package according to claim 3, wherein the heat dissipating layer is made of thermal glue.

5. The chip package according to claim 1, wherein the semiconductor substrate is formed through chip process, and the plurality of connecting channels are formed through wiring process.

6. The chip package according to claim 1, further comprising:
a package housing covering the package substrate; and
filling medium filled in the package housing.

7. The chip package according to claim 1, wherein the package substrate is a ceramic substrate.

8. An electronic device, comprising:
a housing; and
a chip package provided inside a space enclosed by the housing;
wherein, the chip package comprises:
a package substrate;
a semiconductor substrate provided on the package substrate, the semiconductor substrate comprising:
a first group of pins and a second group of pins arranged on the semiconductor substrate;
a connecting layer located between the first group of pins and the second group of pins, wherein the connecting layer has a plurality of connecting channels, and the first group of pins and the second group of pins are connected through the plurality of connecting channels; and
a first chip and a second chip provided on the semiconductor substrate, wherein the first chip has a third group of pins, the second chip has a fourth group of pins, and the third group of pins are connected to the first group of pins respectively, and the fourth group of pins are connected to the second group of pins respectively;
wherein the third group of pins are connected to the first group of pins respectively through a plurality of first metal balls, and the fourth group of pins are connected to the second group of pins through respectively a plurality of second metal balls; and
wherein the plurality of first metal balls and the plurality of second metal balls are made of stannum.

9. The electronic device according to claim 8, wherein the semiconductor substrate is made of silicon.

10. The electronic device according to claim 8, further comprising:

a heat dissipating layer covering the first chip and the second chip.

11. The electronic device according to claim 10, wherein the heat dissipating layer is made of thermal glue.

12. The electronic device according to claim 8, wherein the semiconductor substrate is formed through chip process, and the plurality of connecting channels are formed through wiring process.

13. The electronic device according to claim 8, further comprising: a package housing covering the package substrate; and filling medium filled in the package housing.

14. The electronic device according to claim 8, wherein the package substrate is a ceramic substrate.

* * * * *